US009515737B2

(12) United States Patent
Luo et al.

(10) Patent No.: US 9,515,737 B2
(45) Date of Patent: Dec. 6, 2016

(54) METHOD AND DEVICE FOR DATA COMPRESSION, TRANSMISSION, AND DECOMPRESSION

(71) Applicant: China Academy of Telecommunications Technology, Beijing (CN)

(72) Inventors: Feiqiong Luo, Beijing (CN); Bin Ren, Beijing (CN); Qiong Li, Beijing (CN)

(73) Assignee: CHINA ACADEMY OF TELECOMMUNICATIONS TECHNOLOGY, Beijing (CN)

( * ) Notice: Subject to any disclaimer, the term of this patent is extended or adjusted under 35 U.S.C. 154(b) by 1 day.

(21) Appl. No.: 14/422,896

(22) PCT Filed: Jul. 30, 2013

(86) PCT No.: PCT/CN2013/080405
§ 371 (c)(1),
(2) Date: Feb. 20, 2015

(87) PCT Pub. No.: WO2014/029260
PCT Pub. Date: Feb. 27, 2014

(65) Prior Publication Data
US 2015/0295652 A1  Oct. 15, 2015

(30) Foreign Application Priority Data
Aug. 21, 2012 (CN) .......................... 2012 1 0298915

(51) Int. Cl.
*H04B 10/2575* (2013.01)
*H04B 10/516* (2013.01)
*H04B 10/60* (2013.01)
(Continued)

(52) U.S. Cl.
CPC ......... *H04B 10/25753* (2013.01); *H03M 7/14* (2013.01); *H03M 7/30* (2013.01);
(Continued)

(58) Field of Classification Search
None
See application file for complete search history.

(56) References Cited

U.S. PATENT DOCUMENTS

2004/0136566 A1   7/2004   Cho et al.
2011/0099295 A1   4/2011   Wegener
(Continued)

FOREIGN PATENT DOCUMENTS

CN   101615911   12/2009
CN   101771416   7/2010
(Continued)

OTHER PUBLICATIONS

International Search Report for PCT/CN2013/080405 mailed Dec. 12, 2013.
(Continued)

*Primary Examiner* — Darren E Wolf
(74) *Attorney, Agent, or Firm* — Foley & Lardner LLP; James F. Ewing; Paul M. H. Pua

(57) ABSTRACT

Disclosed are a method and device for data compression, transmission, and decompression. In the present method, data-to-be-transmitted is grouped by a transmitting terminal, and for each group: a shift factor is determined based on the most significant bit of sample data of the greatest value in the group when a sign bit is removed, data bits of the sample data in the group are left shifted by the shift factor; the left shifted sample data respectively are quantified, thus making the bit number of the quantified sample data to be equal to a predefined bit number; the shift factor and the quantified sample data are transmitted to a receiving terminal. Employment of the present application optimizes data compression performance.

20 Claims, 9 Drawing Sheets

(51) Int. Cl.
  *H03M 7/30* (2006.01)
  *H04B 7/06* (2006.01)
  *H03M 7/14* (2006.01)
  H04L 29/06 (2006.01)
  H04L 27/00 (2006.01)
  H04L 5/00 (2006.01)
  H04B 7/10 (2006.01)
  H04L 27/36 (2006.01)

(52) U.S. Cl.
  CPC ......... *H04B 7/0691* (2013.01); *H04B 10/516* (2013.01); *H04B 10/60* (2013.01); *H04B 7/10* (2013.01); *H04L 5/0023* (2013.01); *H04L 27/366* (2013.01); *H04L 69/04* (2013.01); *H04L 2027/0016* (2013.01)

(56) References Cited

U.S. PATENT DOCUMENTS

2012/0207206 A1   8/2012   Samardzija et al.
2004/0146104 A1   7/2014   De Lameillieure

FOREIGN PATENT DOCUMENTS

CN   101980464   2/2011
CN   102597948 A   7/2012

OTHER PUBLICATIONS

Extended European Search Report for EP Application No. 13831399.4 mailed Sep. 28, 2015.

--Prior Art--

D1:  000 0101 1001 0111 (Bit 14 ... Bit 0)
D2:  100 1011 0100 0001
D3:  101 0110 1101 1101
D4:  000 0001 1110 0110

D1:  000 1011 0010 1110 (Bit 14 ... Bit 0)
D2:  101 0110 1000 0010
D3:  110 1101 1011 1010
D4:  000 0011 1100 1100

D1: 000 1011  ← Bit 6 ... Bit 0
D2: 101 0110
D3: 110 1101
D4: 000 0011

Fig.6K

D1: 000 1011 0000 0000  ← Bit 14 ... Bit 0
D2: 101 0110 0000 0000
D3: 110 1101 0000 0000
D4: 000 0011 0000 0000

Fig.6L

D1: 000 1011 1000 0000  ← Bit 14, Bit 7, Bit 0
D2: 101 0110 1000 0000
D3: 110 1101 1000 0000
D4: 000 0011 1000 0000

Fig.6M

D1:  000 0101 1100 0000  (Bit 14 ... Bit 0)
D2:  100 1011 0100 0000
D3:  101 0110 1100 0000
D4:  000 0001 1100 0000
Fig.6N
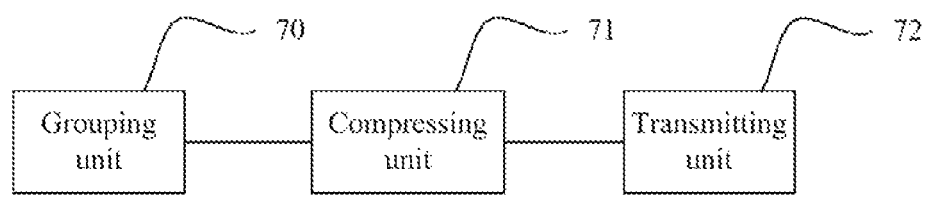
Fig.7
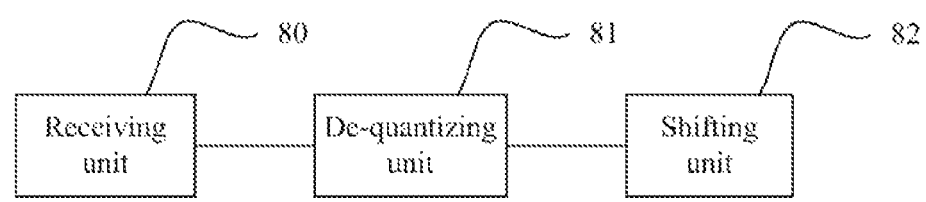
Fig.8

METHOD AND DEVICE FOR DATA COMPRESSION, TRANSMISSION, AND DECOMPRESSION

This application is a US National Stage of International Application No. PCT/CN2013/080405, filed on Jul. 30, 2013, designating the United States and claiming priority to Chinese Patent Application No. 201210298915.6, filed with the Chinese Patent Office on Aug. 21, 2012 and entitled "Method and device for compressing data, and method and device for decompressing data", which is hereby incorporated by reference in its entirety.

FIELD

The present invention relates to the field of wireless communications and particularly to a method and device for compressing and transmitting data, and a method and device for decompressing data.

BACKGROUND

Evolved Node Bs (eNBs) in the Long Term Evolution (LTE)/Long Term Evolution-Advanced (LTE-A) system are distributed eNB devices, each of which is composed of a Base Band Unit (BBU) and a Radio frequency Remote Unit (RRU) as a combined eNB that can be deployed in a flexibly distributed manner, as illustrated in FIG. 1, in which the RRU is connected with the BBU via an Ir interface.

The transmission medium in the existing Ir interface is an optical fiber or another transmission medium, and if data over the Ir interface is compressed technically in effect, then a demand for the transmission medium can be greatly alleviated to thereby lower the cost of the device and improve the competitiveness of the product in the market.

In the LTE system, there is such an existing solution to compression of data over the Ir interface that an automatic gain adjustment is performed on the input signal to thereby control a dynamic range of the signal and to lower the quantified bit width of the signal in a uniform quantification algorithm. This solution can compress data with a 16-bit bit width into 12 bits, which means a compression ratio of 4:3 representing the ratio of the size of the compressed data to the size of the uncompressed data, while ensuring the reliability of the signal.

As can be apparent, there is low compression ratio in the prior art, and the algorithm may not be widely applicable, due to the fact that the uniform quantification is an optimum quantifier for a uniformly distributed input signal, whereas the simple uniform quantification may not be reasonable to allocation of quantification levels for a non-uniformly distributed input signal because redundant components in the signal may not be removed sufficiently.

SUMMARY

Embodiments of the invention provide a method and device for compressing and transmitting data, and a method and device for decompressing data so as to optimize a solution of data compression.

A method for compressing and transmitting data includes:
grouping, by a transmitting terminal, data to be transmitted so that each group includes at least one data sample; and
determining, by a transmitting terminal, a shift factor for each group according to a most significant bit of a data sample, with a largest value excluding a sign bit in the group; left-shifting data bits of respective data samples in the group respectively by the shift factor;
quantizing the respective left-shifted data samples respectively so that the number of bits of each quantized data sample is equal to a target number of compressed bits; and
transmitting the shift factor and the respective quantized data samples to a receiving terminal.

A method for decompressing data includes:
receiving, by a receiving terminal, a shift factor, and respective quantized data samples, transmitted by a transmitting terminal;
de-quantizing, by the receiving terminal, the respective data samples respectively so that the number of bits of each de-quantized data sample is equal to the original number of un-quantized bits; and
right-shifting, by the receiving terminal, data bits of the respective de-quantized data samples respectively by the shift factor to obtain the decompressed data samples.

A device for compressing and transmitting data includes:
a grouping unit configured to group data to be transmitted so that each group includes at least one data sample;
a compressing unit configured to determine a shift factor for each group according to a most significant bit of a data sample, with a largest value excluding a sign bit in the group; to left-shift data bits of respective data samples in the group respectively by the shift factor; and to quantize the respective left-shifted data samples respectively so that the number of bits of each quantized data sample is equal to a target number of compressed bits; and
a transmitting unit configured to transmit the shift factor and the respective quantized data samples.

A device for decompressing data includes:
a receiving unit configured to receive a shift factor and respective quantized data samples;
a de-quantifying unit configured to de-quantize the respective data samples respectively so that the number of bits of each de-quantized data sample is equal to the original number of un-quantized bits; and
a shifting unit configured to right-shift data bits of the respective de-quantized data samples respectively by the shift factor to obtain the decompressed data samples.

An RRU which is a transmitting terminal includes:
a grouping unit configured to group data to be transmitted so that each group includes at least one data sample;
a compressing unit configured to determine a shift factor for each group according to a most significant bit of a data sample, with a largest value excluding a sign bit in the group; to left-shift data bits of respective data samples in the group respectively by the shift factor; and to quantize the respective left-shifted data samples respectively so that the number of bits of each quantized data sample is equal to a target number of compressed bits; and
a transmitting unit configured to transmit the shift factor and the respective quantized data samples.

A BBU which is a transmitting terminal includes:
a grouping unit configured to group data to be transmitted so that each group includes at least one data sample;
a compressing unit configured to determine a shift factor for each group according to a most significant bit of a data sample, with a largest value excluding a sign bit in the group; to left-shift data bits of respective data samples in the group respectively by the shift factor; and to quantize the respective left-shifted data samples respectively so that the number of bits of each quantized data sample is equal to a target number of compressed bits; and
a transmitting unit configured to transmit the shift factor and the respective quantized data samples.

An RRU which is a receiving terminal includes:

a receiving unit configured to receive a shift factor and respective quantized data samples;

a de-quantifying unit configured to de-quantize the respective data samples respectively so that the number of bits of each de-quantized data sample is equal to the original number of un-quantized bits; and a shifting unit configured to right-shift data bits of the respective de-quantized samples respectively by the shift factor to obtain the decompressed samples.

A BBU which is a receiving terminal includes:

a receiving unit configured to receive a shift factor and respective quantized data samples;

a de-quantifying unit configured to de-quantize the respective data samples respectively so that the number of bits of each de-quantized data sample is equal to the original number of un-quantized bits; and a shifting unit configured to right-shift data bits of the respective de-quantized samples respectively by the shift factor to obtain the decompressed data samples.

An RRU includes a processor, wherein:

when the RRU is a transmitting terminal, the processor is configured to group data to be transmitted so that each group includes at least one data sample; to determine a shift factor for each group according to the most significant bit of a data sample, with the largest value excluding a sign bit in the group; to left-shift data bits of respective data samples in the group respectively by the shift factor; to quantize the respective left-shifted data samples respectively so that the number of bits of each quantized data sample is equal to a target number of compressed bits; and to transmit the shift factor and the respective quantized data samples to a receiving terminal; and when the RRU is a receiving terminal, the processor is configured to receive a shift factor, and respective quantized data samples, transmitted by a transmitting terminal; to de-quantize the respective data samples respectively so that the number of bits of each de-quantized data sample is equal to the original number of un-quantized bits; and to right-shift data bits of the respective de-quantized data samples respectively by the shift factor to obtain the decompressed data samples.

A BBU includes a processor, wherein:

when the BBU is a transmitting terminal, the processor is configured to group data to be transmitted so that each group includes at least one data sample; to determine a shift factor for each group according to a most significant bit of a data sample, with the largest value excluding a sign bit in the group; to left-shift data bits of respective data samples in the group respectively by the shift factor; to quantize the respective left-shifted data samples respectively so that the number of bits of each quantized data sample is equal to a target number of compressed bits; and to transmit the shift factor and the respective quantized data samples to a receiving terminal; and when the BBU is a receiving terminal, the processor is configured to receive a shift factor, and respective quantized data samples, transmitted by a transmitting terminal; to de-quantize the respective data samples respectively so that the number of bits of each de-quantized data sample is equal to the original number of un-quantized bits; and to right-shift data bits of the respective de-quantized samples respectively by the shift factor to obtain the decompressed data samples.

In the solutions according to the embodiments of the invention, the transmitting terminal groups data to be transmitted so that each group includes at least one data sample; determines a shift factor for each group from the most significant bit of a data sample, with the largest value excluding a sign bit in the group; left-shifts data bits of respective data samples in the group respectively by the shift factor; quantizes the respective left-shifted data samples respectively so that the number of bits of each quantized data sample is equal to a target number of compressed bits; and transmits the shift factor and the respective quantized data samples to the receiving terminal As can be apparent, this solution groups the data to be transmitted and shifts and compresses each resulting group respectively to thereby shift and compress the data in segments so as to improve the performance of data compression.

The receiving terminal receives the shift factor and the respective quantized data samples transmitted by the transmitting terminal, and then de-quantizes the respective data samples respectively so that the number of bits of each de-quantized data sample is equal to the original number of un-quantized bits, and further right-shifts the data bits in the respective de-quantized data samples respectively by the shift factor into the decompressed data samples to thereby perform data decompression corresponding to data compression above.

BRIEF DESCRIPTION OF THE DRAWINGS

FIG. 6C illustrates a schematic diagram of grouping of data according to a third embodiment of the invention;

FIG. 6D illustrates a schematic diagram of grouping of data according to a fourth embodiment of the invention;

FIG. 6H illustrates a schematic diagram of a frame format of the compressed IQ data according to the seventh embodiment of the invention;

FIG. 6I to FIG. 6N illustrate schematic diagrams of data samples throughout data compression and decompression according to the seventh embodiment of the invention;

FIG. 7 illustrates a schematic structural diagram of a device according to an embodiment of the invention; and FIG. 8 illustrates a schematic structural diagram of another device according to an embodiment of the invention.

DETAILED DESCRIPTION OF THE EMBODIMENTS

In order to optimize the performance of data compression, an embodiment of the invention provides a method for compressing and transmitting data. In this method, a transmitting terminal groups data to be transmitted, determines a shift factor for each group according to the most significant bit of a data sample, with the largest value excluding a sign bit in the group, left-shifts data bits of respective data samples in the group respectively by the shift factor, quantizes the respective left-shifted data samples respectively so that the number of bits of each quantized data sample is equal to a target number of compressed bits, and transmits the shift factor and the respective quantized data samples to a receiving terminal.

Figure 1:
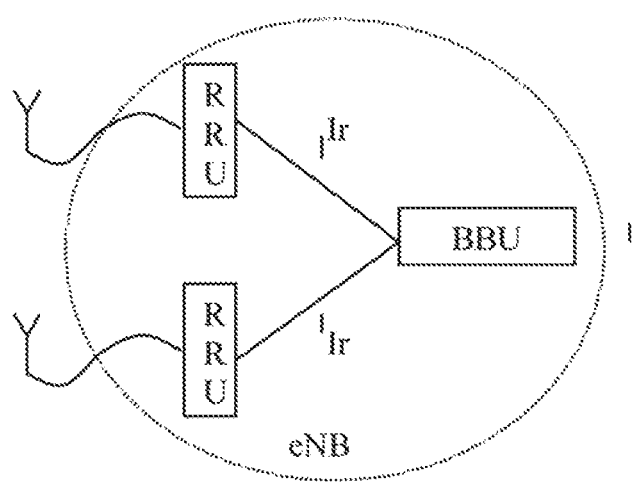
FIG. 1 illustrates a schematic diagram of a distributed eNB in the prior art.
Figure 2:
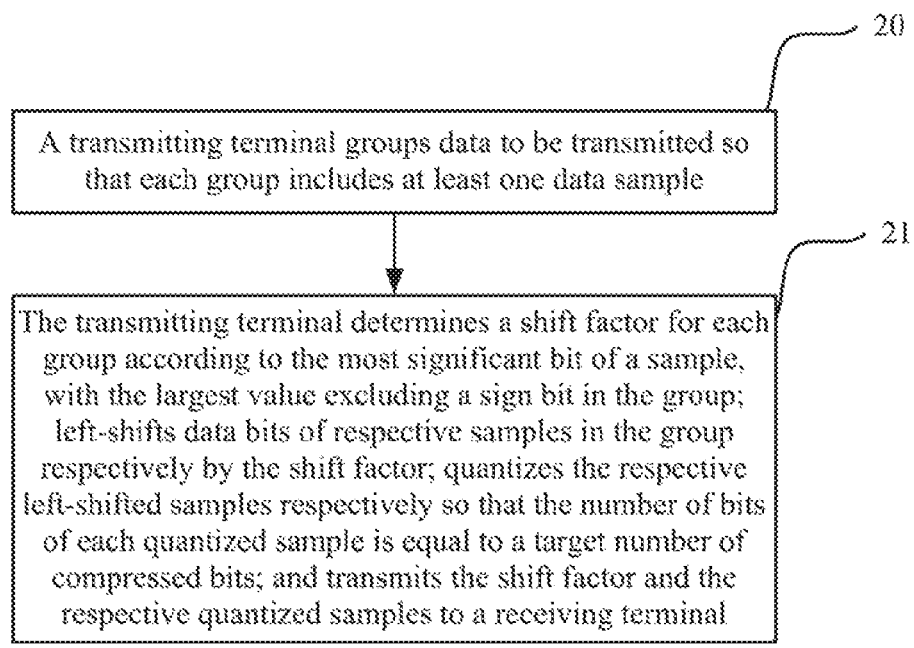
FIG. 2 illustrates a flow chart of a method according to an embodiment of the invention.

Referring to FIG. 2, a method for compressing and transmitting data by a data transmitting terminal according to an embodiment of the invention includes the following operations:

Operation 20: A transmitting terminal groups data to be transmitted so that each group includes at least one data sample; and Operation 21: The transmitting terminal determines a shift factor for each group according to the most significant bit of a data sample, with the largest value excluding a sign bit in the group; left-shifts data bits of respective data samples in the group respectively by the shift factor; quantizes the respective left-shifted data samples respectively so that the number of bits of each quantized data sample is equal to a target number of compressed bits; and transmits the shift factor and the respective quantized data samples to a receiving terminal. Here the shift factor represents the number of shift bits by which the data bits of the data samples are left-shifted; and the data bits of the data samples are left-shifted by maintaining the sign bits of the data samples, removing N bits on the left of the data bits and padding N zeros to the right side of the data bits, thus resulting the left-shifted data sample.

In the operation 20, when the data to be transmitted consists of real component (I data) and imaginary component (Q data) of data (i.e., real component and imaginary component of data is referred to the IQ data), the data to be transmitted can be grouped based on the following two principles:

The first principle relates to a correlation between the I data and the Q data, and if there is a high correlation between the I and Q data, then the I data and the Q data can be grouped jointly; otherwise, the I data and the Q data can be grouped separately; and The second principle relates to a correlation between different antennas, and if there is a high correlation between different antennas, the antennas can be grouped jointly; otherwise, the respective antennas can be grouped separately. If the antennas are grouped jointly, then the antennas are preferably grouped as antennas polarized in the same direction.

A particular grouping schemes can be one of the following schemes:

In a first scheme, the IQ data of each antenna are grouped separately and the I data and the Q data are grouped separately, so that at least one consecutive I data of the same antenna is grouped together or at least one consecutive Q data of the same antenna is grouped together;

In a second scheme, the IQ data of each antenna are grouped separately and the I component of data and the Q component of data are grouped jointly, so that at least one consecutive I data and at least one consecutive Q data of the same antenna are grouped together;

In a third scheme, the IQ data of a plurality of antennas are grouped jointly and the I data and the Q data are grouped separately, so that the I data of the same samples of the antennas at the same locations are grouped together or the Q data of the same samples of the antennas at the same locations are grouped together; and the same location here particularly refers to the same time location, i.e., the same instance of time;

In a fourth scheme, the IQ data of a plurality of antennas are grouped jointly and the I data and the Q data are grouped jointly, so that the I data and the Q data of the antennas at the same locations are grouped together;

In a fifth scheme, the IQ data of a plurality of antennas are grouped jointly and the I data and the Q data are grouped separately, so that the I data of at least one consecutive samples of the antennas at the same locations are grouped together or the Q data of at least one consecutive samples of the antennas at the same locations are grouped together; and In a sixth scheme, the IQ data of a plurality of antennas is grouped jointly and the I data and the Q data are grouped jointly, so that the I data and the Q data of at least one consecutive samples of the antennas at the same locations are grouped together.

Here the IQ data refers to data transmitted over an Ir interface between an RRU and a BBU.

Of course a scheme of grouping the data to be transmitted will not be limited to the six schemes above, but any scheme in which the data to be transmitted can be grouped will fall into the scope of the invention, for example, the data to be transmitted is grouped randomly according to samples, etc.

In the operation 21, the shift factor can be determined according to the most significant bit of the data sample, with the largest value excluding the sign bit in the group particularly as follows:

Firstly the largest number of shift bits which can be represented by the shift factor is determined Here the largest number C of shift bits which can be represented by the shift factor can be determined in the equation of $C=2^{(n*k/2)}-1$, where ^ represents the power of 2, n represents the number of data samples in the group, and k represents the number of control bits in which the shift factor is transmitted, for example, k can be 1; and particularly assuming the number k (typically 1) of control bits AGC, if the I data and the Q data are grouped separately, and n data samples (I data or Q data) are grouped together, then the shift factor may be (n*k) bits, in which the I data or the Q data are n*k/2 bits respectively, and the largest number of shift bits which can be represented is $2^{(n*k/2)}-1$ (starting with 0); and if the I data and the Q data are grouped jointly, and n/2 I data and n/2 Q data are grouped together, then the shift factor may be n*k/2 bits, and the largest number of shift bits which can be represented is $2^{(n*k/2)}-1$ (starting with 0);

Then the data sample, with the largest value excluding the sign bit in the group and the bit index of the most significant bit of the data sample excluding the sign bit are determined. Here the most significant bit of the data sample excluding the sign bit refers to the first bit "1", from the left to the right, of the data sample excluding the sign bit, the respective bits are indexed sequentially starting with 0 from the right to the left. For example, for a data sample 100100001, the sample excluding the most significant sign bit is 00100001, and the respective bits are indexed sequentially from the right to the left as 0, 1, 2, 3, 4, 5, 6 and 7, and the bit index of the most significant bit of the data sample excluding the sign bit is 5.

Finally if A is no larger than the largest number of shift bits, then the shift factor is determined to be equal to A; otherwise, the shift factor is determined to be equal to the largest number of shift bits, in which A=W−1−H, W represents the number of bits of the data sample, excluding the sign bit, in the group, and H represents the bit index of the most significant bit.

Here the shift factor can be a differential shift factor, that is, the shift factor of the first group is an absolute value so that the shift factors of the remaining groups can be equal to the differences of the shift factors of the respective groups and the shift factor of the first group, as calculated above.

Preferably in order to improve the precision of compression, after the largest number of shift bits which can be represented by the shift factor is determined, and before the data sample, with the largest value excluding the sign bit in the group and the number of the most significant bit of the sample excluding the sign bit are determined, if the bit index of the most significant bit, excluding the sign bit, of the data sample, with the largest value excluding the sign bit in the group is E, or all the bit indexes of the most significant bits of data samples of more than a preset proportion in the group are smaller than or equal to E, then the respective samples in the group are saturated into E bits, where E represents an integer larger than 0 and smaller than W. Here a data sample is saturated into E bits as follows: a sign bit of the data sample remain unchanged, and if the data sample excluding the sign bit is larger than a reference sample, then the data sample excluding the sign bit is updated to the reference sample, and if the data sample excluding the sign bit is no larger than the reference sample, then the data sample is maintained, where the number of bits of the reference sample is W, and all the least significant E bits of the reference sample are 1, whereas all the remaining bits thereof are 0. For example, if the data sample is 100011001, E=3, and the data sample excluding the most significant sign bit is larger than the reference sample 00000111, then the data sample is saturated into 100000111; and in another example, if the data sample is 100000011, E=3, and the data sample excluding the most significant sign bit is no larger than the reference sample 00000111, then the data sample is still saturated into 100000111.

In the operation 21, the respective left-shifted data samples can be quantized respectively particularly in the following uniform quantization:

For each left-shifted data sample, the sign bit of the data sample is maintained, (V−1) bits of data are captured starting from the most significant bit to least significant bit among the data bits, and the quantized data sample is formed from the sign bit and the captured bits of data, in which V represents the target number of compressed bits. For example, if the left-shifted data sample is 10001000, V=4, the most significant sign bit is 1, and 3 bits of data captured, starting from the most significant bit to least significant bit, among the data bits are 000, then the quantized data sample consisted of the sign bit and the captured bits of data is 1000.

In this method, the transmitting terminal can be an RRU, and the receiving terminal can be a BBU; or the transmitting terminal can be a BBU, and the receiving terminal can be an RRU. Of course, the transmitting terminal can be any other data transmitter, and the receiving terminal can be any other data receiver.

Figure 3:
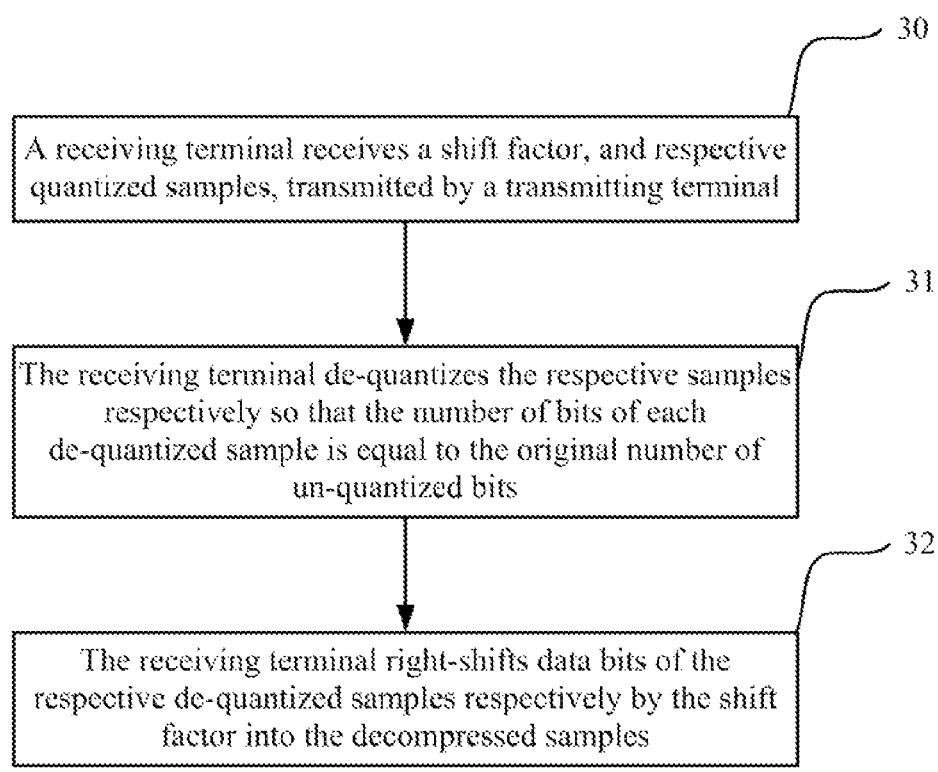
FIG. 3 illustrates a flow chart of another method according to an embodiment of the invention.

Referring to FIG. 3, in order to provide a method for decompressing data corresponding to the method for compressing data as illustrated in FIG. 2, an embodiment of the invention provides a method for decompressing data including the following operations:

Operation 30: A receiving terminal receives a shift factor, and respective quantized data samples, transmitted by a transmitting terminal;

Operation 31: The receiving terminal de-quantizes the respective data samples respectively so that the number of bits of each de-quantized data sample is equal to the original numbers of un-quantized bits. Here the receiving terminal de-quantizes the respective data samples according to quantization of the corresponding samples by the transmitting terminal; and Operation 32: The receiving terminal right-shifts data bits of the respective de-quantized data samples respectively by the shift factor to obtain the decompressed data samples. Here the number of right shift bits is equal to a value corresponding to the shift factor.

In the operation 31, the receiving terminal can de-quantize the respective data samples respectively particularly as follows:

For each data sample, B zeros are padded to the right side of the data sample resulting in the de-quantized data sample, where B=W−V, W represents the number of bits of the un-quantized data sample excluding the sign bit, and V represents the number of bits of the quantized data sample. This scheme can be applicable when uniform quantization is performed by the transmitting terminal.

Preferably in order to improve the accuracy of a decompression result, after the de-quantized data samples are obtained, and before the data bits of the respective de-quantized data samples are right-shifted respectively by the shift factor, a preset offset can be added respectively to the de-quantized samples, where the preset offset ranging from (0, 2^(B−1)], and ^ represents the power of 2, for example, the preset offset is equal to 2^(B−1); and accordingly in the operation 32, the receiving terminal right-shifts the data bits of the respective samples, with the added preset offset, by the shift factor.

In this method, the transmitting terminal can be an RRU, and the receiving terminal can be a BBU; or the transmitting terminal can be a BBU, and the receiving terminal can be an RRU.

The invention will be described below in details.

Figure 4:
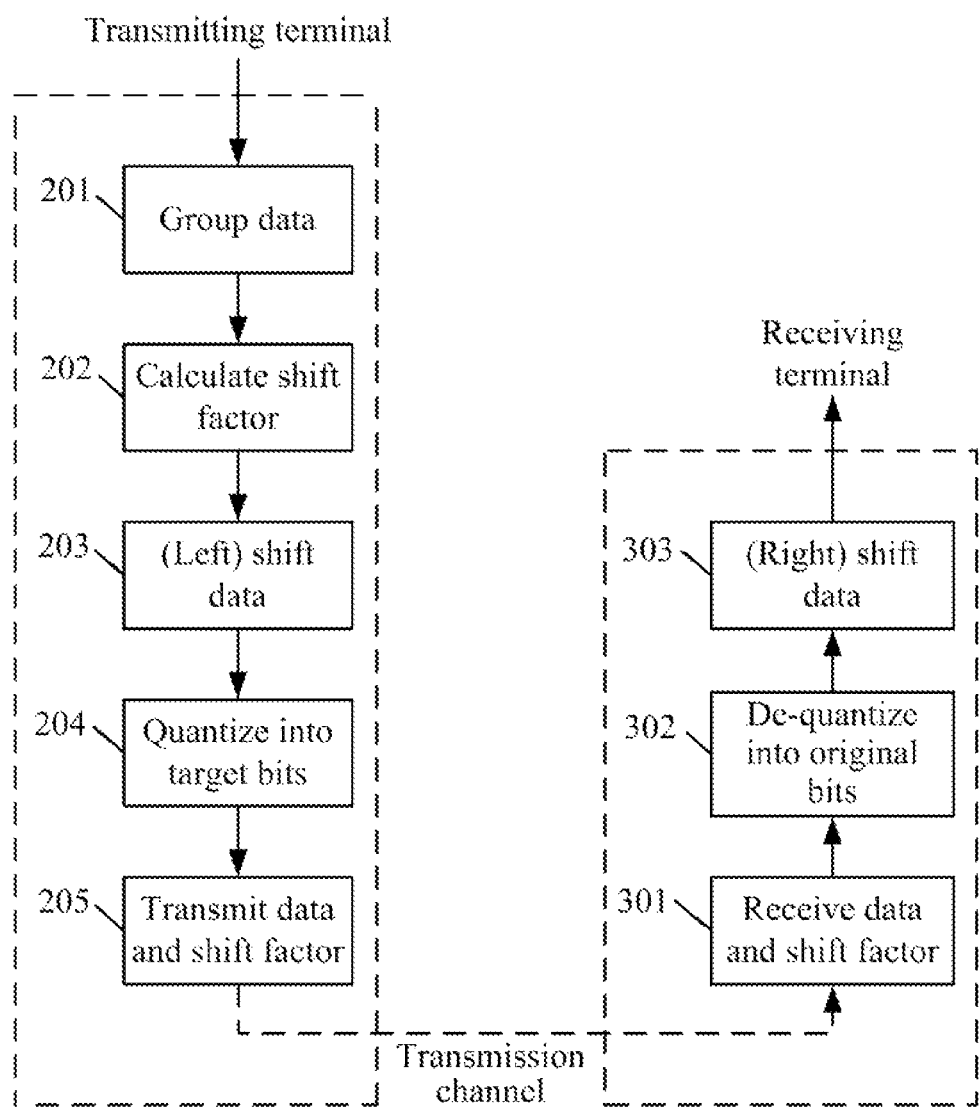
FIG. 4 illustrates a schematic flow chart of a method for compressing and decompressing data according to an embodiment of the invention.

As illustrated in FIG. 4, a process flow of the transmitting terminal and the receiving terminal according to an embodiment of the invention is as follows:

Operation 201: A compression module of a transmitting terminal groups data to be transmitted so that each group includes at least one data sample;

Operation 202: The compression module determines a shift factor for each group according to the most significant bit of a data sample, with the largest value excluding a sign bit in the group;

Operation 203: The compression module left-shifts data bits of respective data samples in the group respectively by the shift factor;

Operation 204: The compression module quantizes the respective left-shifted data samples respectively so that the number of bits of each quantized data sample is equal to a target number of compressed bits; and Operation 205: The compression module puts the shift factor and the quantized data samples onto a transmission channel for transmission.

Operation 301: A decompression module of a receiving terminal receives the shift factor and the respective quantized data samples;

Operation 302: The decompression module de-quantizes the respective data samples respectively so that the number of bits of each de-quantized data sample is equal to the original numbers of un-quantized bits; and Operation 303: The decompression module right-shifts the data bits of the respective de-quantized data samples respectively by the shift factor to obtain the decompressed data samples.

Figure 5:
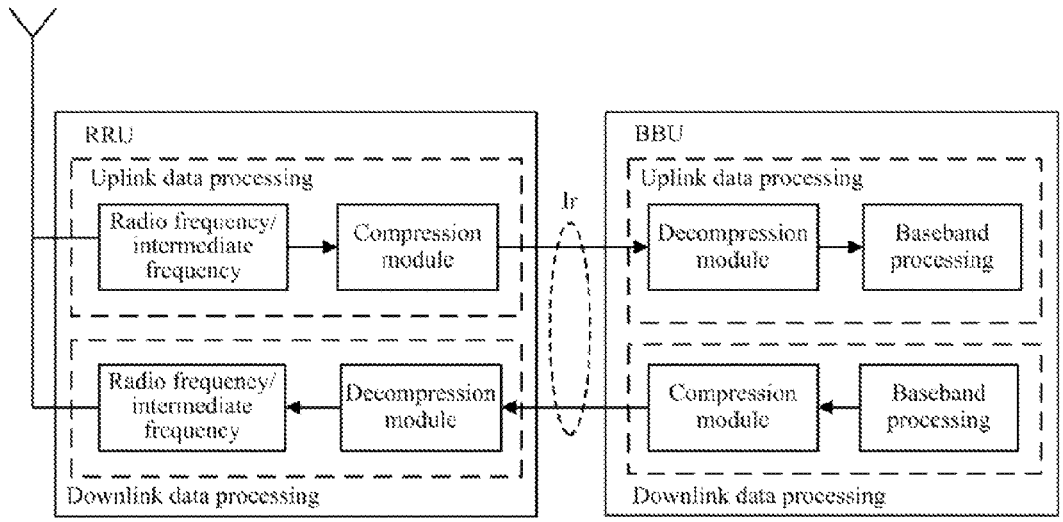
FIG. 5 illustrates a schematic architectural diagram of a device including data compression and decompression modules according to an embodiment of the invention.

Particularly when the invention is applied to compression of data over an Ir interface in a 3G/4G system, the compression module and the decompression module are positioned in the system as illustrated in FIG. 5, where in the uplink, the compression module resides at the RRU side, and accordingly the decompression module resides at the BBU side; and in the downlink, the compression module resides at the BBU side, and accordingly the decompression module resides at the RRU side.

The six schemes of grouping data will be presented below in a first embodiment to a sixth embodiment:

First Embodiment

Figure 6A:
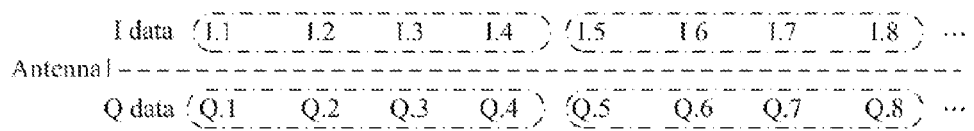
FIG. 6A illustrates a schematic diagram of grouping of data according to a first embodiment of the invention.

As illustrated in FIG. 6A, in the first scheme of grouping data, four I data or four Q data are grouped together, and each antenna is grouped separately.

Second Embodiment

Figure 6B:
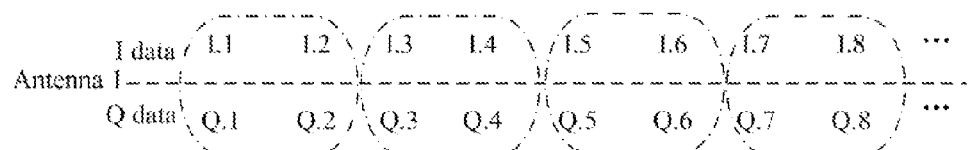
FIG. 6B illustrates a schematic diagram of grouping of data according to a second embodiment of the invention.

As illustrated in FIG. 6B, in the second scheme of grouping data, two I data and two Q data are grouped together, and each antenna is grouped separately.

Third Embodiment

Figures 6C, 6D:
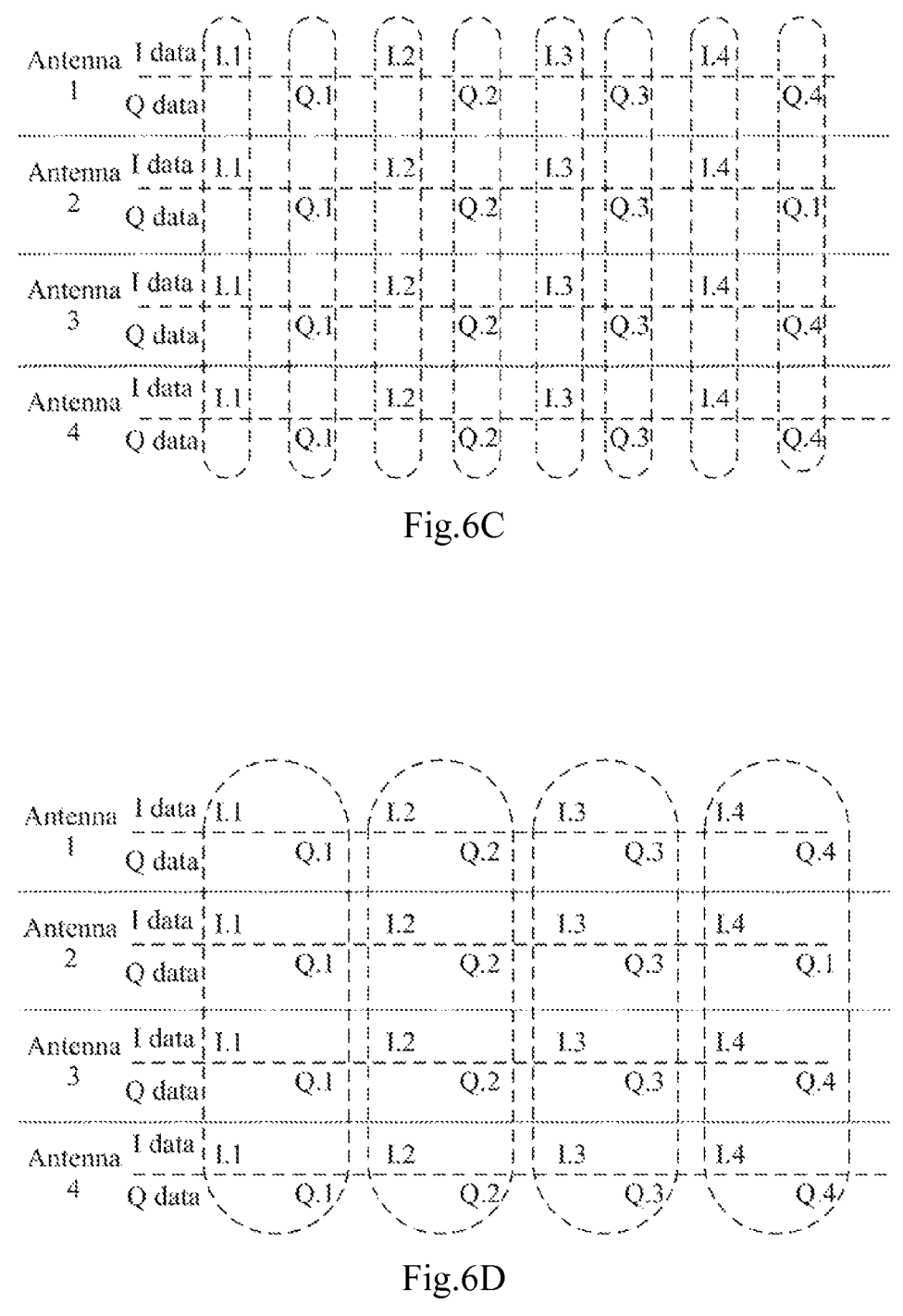

As illustrated in FIG. 6C, in the third scheme of grouping data, the same I data or the same Q data of four antennas polarized in the same direction are grouped together.

Fourth Embodiment

As illustrated in FIG. 6D, in the fourth scheme of grouping data, I data and Q data of four antennas polarized in the same direction are grouped together.

Fifth Embodiment

Figures 6E, 6F, 6G:
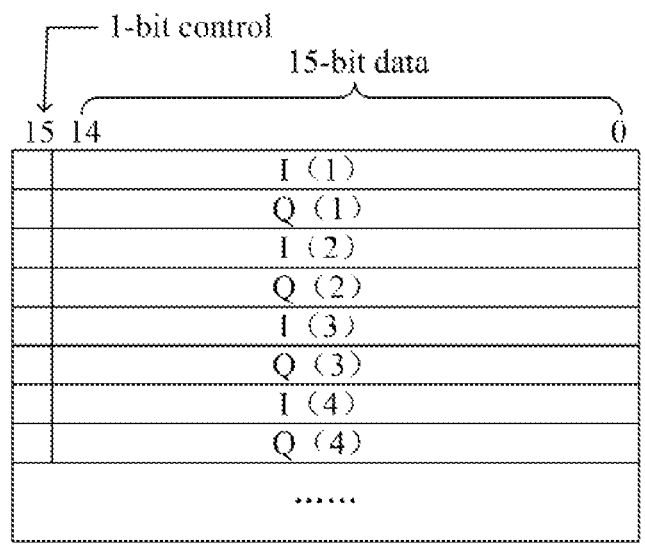
FIG. 6E illustrates a schematic diagram of grouping of data according to a fifth embodiment of the invention.
FIG. 6F illustrates a schematic diagram of grouping of data according to a sixth embodiment of the invention.
FIG. 6G illustrates a schematic diagram of a frame format of uncompressed IQ data according to a seventh embodiment of the invention.

As illustrated in FIG. 6E, in the fifth scheme of grouping data, two consecutive I data of two antennas polarized in the same direction are grouped together, whereas two consecutive Q data of the two antennas polarized in the same direction are grouped together, although FIG. 6E illustrates a schematic diagram of only the grouped I data.

Sixth Embodiment

As illustrated in FIG. 6F, in the sixth scheme of grouping data, two consecutive I data and two consecutive Q data of two antennas polarized in the same direction are grouped together.

Seventh Embodiment

Figures 6H, 6I, 6J:
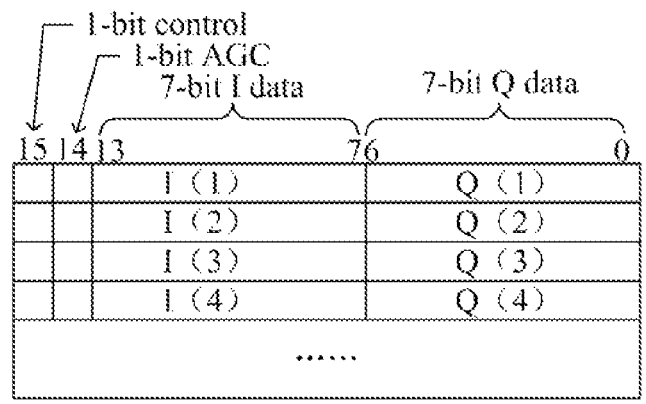

For the sake of a convenient description, only the existing solution to compression of 15 bits of IQ data into 7 bits in the 3G/4G system will be described in this embodiment. FIG. 6G illustrates a frame format of un-compressed IQ data, and FIG. 6H illustrates a frame format of the compressed IQ data. It shall be noted that the invention will not be limited to the frame formats mentioned in this context.

In this embodiment, binary data is represented as true codes. 15 bits of un-compressed IQ data include 15 bits of I data and 15 bits of Q data, where there are 1 sign bit and 14 data bits, and they are compressed into 7 bits including 1 sign bit and 6 data bits. That is, the un-compressed word length (i.e., number of bits) excluding the sign bit is W=14, and the compressed word length excluding the sign bit is V=6.

Operation 1: A transmitting terminal groups IQ data to be transmitted, for details of which reference can be made to the first embodiment to the sixth embodiment.

It is assumed that four data samples are grouped together and a shift factor is 2 bits representing the number of shift bits ranging from 0 to 3. For example, FIG. 6I illustrates four data samples in the group i.

Operation 2: A shift factor is calculated for the group i, in which a data sample, excluding a sign bit, with the largest value in the group is D3, and the bit index of the most significant bit of D3 excluding the sign bit is H=12, that is, the shift factor is equal to (W−1−H)=14−1−12=1.

Operation 3: Respective data samples in the group i are left-shifted by one bit (the sign bits are maintained, and data bits are left-shifted by one bit) into the data samples illustrated in FIG. 6J.

Operation 4: The respective data samples illustrated in FIG. 6J are quantized respectively into a target number of bits, which is 7 bits, that is, six bits are captured, starting from the most significant bit to least significant bit, from data bits of the shifted data samples whereas the sign bits are maintained, resulting in the quantized data samples as illustrated in FIG. 6K, and the quantized data samples are transmitted to a receiving terminal.

Operation 5: The receiving terminal de-quantizes the received data samples, that is, firstly 8 zeros ((W−V)=14−6=8) are padded to the right side of the 7-bit data samples resulting into 15 bits, as illustrated in FIG. 6L.

Operation 6: An error is compensated for, that is, an offset a is added to D1 to D4 as illustrated in FIG. 6L resulting in the data samples as illustrated in FIG. 6M, given a=2^(W−V−1)=2^(14−6−1)=2^7.

Operation 7: The respective data samples as illustrated in FIG. 6M are right-shifted respectively by one bit (the sign bits are maintained, and the data bits are right-shifted by one bit) into the samples illustrated in FIG. 6N, i.e., the data samples decompressed by the receiving terminal.

Referring to FIG. 7, an embodiment of the invention provides a device for compressing and transmitting data, the device including:

A grouping unit 70 is configured to group data to be transmitted so that each group includes at least one data sample;

A compressing unit 71 is configured to determine for each group a shift factor according to the most significant bit of a data sample, excluding a sign bit, with the largest value in the group; to left-shift data bits of respective data samples in the group respectively by the shift factor; and to quantize the respective left-shifted data samples respectively so that the number of bits of each quantized data sample is equal to a target number of compressed bits; and A transmitting unit 72 is configured to transmit the shift factor and the respective quantized data samples.

Furthermore the grouping unit 70 is configured:

When the data to be transmitted is real and imaginary (IQ) data, to group the data to be transmitted as follows:

To group the IQ data of each antenna separately, and to group the I data and the Q data separately so that at least one consecutive I data of the same antenna is grouped together or at least one consecutive Q data of the same antenna is grouped together; or To group the IQ data of each antenna separately, and to group the I data and the Q data jointly so that at least one consecutive I data and at least one consecutive Q data of the same antenna are grouped together; or To group the IQ data of a plurality of antennas jointly, and to group the I data and the Q data separately so that the I data of the same samples of the antennas at the same locations are grouped together or the Q data of those same samples together; or To group the IQ data of a plurality of antennas jointly, and to group the I data and the Q data jointly so that the I data and the Q data of the antennas at the same locations are grouped together; or To group the IQ data of a plurality of antennas jointly, and to group the I data and the Q data separately so that the I data of at least one consecutive data samples of the antennas at the same locations is grouped together or the Q data of the at least one consecutive samples is grouped together; or To group the IQ data of a plurality of antennas jointly, and to group the I data and the Q data jointly so that the I data and the Q data of at least one consecutive data samples of the antennas at the same locations are grouped together.

Furthermore the compressing unit 71 configured to determine the shift factor according to the most significant bit of the data sample, excluding the sign bit, with the largest value in the group is configured:

To determine the largest number of shift bits which can be represented by the shift factor;

To determine the data sample, excluding the sign bit, with the largest value in the group and the bit index of the most significant bit of the data sample excluding the sign bit; and If A is no larger than the largest number of shift bits, to determine the shift factor to be equal to A; otherwise, to determine the shift factor to be equal to the largest number of shift bits, where $A=W-1-H$, W represents the number of bits of the data sample, excluding the sign bit, in the group, and H represents the bit index of the most significant bit.

Furthermore the compressing unit 71 is configured to determine the largest number C of shift bits which can be represented by the shift factor in the equation of: $C=2^{\wedge}(n*k/2)-1$, Where $^{\wedge}$ represents the power of 2, n represents the number of data samples in the group, and k represents the number of control bits in which the shift factor is transmitted.

Furthermore the compressing unit 71 is further configured:

After the largest number of shift bits which can be represented by the shift factor is determined, and before the data sample, with the largest value excluding the sign bit in the group and the bit index of the most significant bit of the data sample excluding the sign bit are determined, if the bit index of the most significant bit of the data sample, with the largest value excluding the sign bit in the group is E, or there are more than a preset proportion of data samples, of which the bit indexes of the most significant bits, excluding sign bits, are smaller than or equal to E, in the group, to saturate the respective data samples in the group into E bits, where E represents an integer larger than 0.

Furthermore the compressing unit 71 is configured to quantize the respective left-shifted data samples respectively as follows:

To capture V bits of data, starting from the most significant bit to least significant bit, from the respective left-shifted data samples resulting in the quantized data samples.

Referring to FIG. 8, an embodiment of the invention provides a device for decompressing data, the device including:

A receiving unit 80 is configured to receive a shift factor and respective quantized data samples;

A de-quantifying unit 81 is configured to de-quantize the respective data samples respectively so that the number of bits of each de-quantized data sample is equal to the original numbers of un-quantized bits; and A shifting unit 82 is configured to right-shift data bits of the respective de-quantized data samples respectively by the shift factor to obtain the decompressed data samples.

Furthermore the de-quantifying unit 81 is configured:

For each data sample, to pad B zeros to the right side of the data sample resulting in the de-quantized data sample, where $B=W-V$, W represents the number of bits of the un-quantized sample data excluding the sign bit, and V represents the number of bits of the quantized data sample. This scheme can be applicable when uniform quantization is performed by the transmitting terminal.

Furthermore the de-quantifying unit 81 is further configured:

After the de-quantized samples are obtained, and before the shifting unit right-shifts the data bits of the respective de-quantized data samples respectively by the shift factor, to add a preset offset respectively to the de-quantized data samples, where the preset offset ranging from $(0, 2^{\wedge}(B-1)]$, and $^{\wedge}$ represents the power of 2; and The shifting unit 82 is configured:

To right-shift the data bits of the respective data samples, with the added preset offset, by the shift factor.

In summary, advantageous effects of the invention includes:

In the solutions according to the embodiments of the invention, a transmitting groups the data to be transmitted so that each group includes at least one data sample; determines for each group a shift factor according to the most significant bit of a data sample, with the largest value excluding a sign bit in the group; left-shifts data bits of respective data samples in the group respectively by the shift factor; quantizes the respective left-shifted data samples respectively so that the number of bits of each quantized sample is equal to a target number of compressed bits; and transmits the shift factor and the respective quantized data samples to a receiving terminal As can be apparent, this solution groups the data to be transmitted and shifts and compresses each resulting group respectively to thereby shift and compress the data in segments so as to improve the performance of data compression.

The receiving terminal receives the shift factor and the respective quantized data samples transmitted by the transmitting terminal, and then de-quantizes the respective data samples respectively so that the number of bits of each de-quantized sample is equal to the original number of un-quantized bits, and further right-shifts the data bits in the respective de-quantized samples respectively by the shift factor into the decompressed data samples to thereby perform data decompression corresponding to data compression above.

Based upon the same inventive idea as the method, an embodiment of the invention further provides an RRU which is a transmitting terminal including:

A grouping unit is configured to group data to be transmitted so that each group includes at least one data sample;

A compressing unit is configured to determine for each group a shift factor according to the most significant bit of a data sample, excluding a sign bit, with the largest value in the group; to left-shift data bits of respective data samples in the group respectively by the shift factor; and to quantize the respective left-shifted data samples respectively so that the number of bits of each quantized data sample is equal to a target number of compressed bits; and A transmitting unit is configured to transmit the shift factor and the respective quantized data samples.

Based upon the same inventive idea as the method, an embodiment of the invention further provides a BBU which is a transmitting terminal including:

A grouping unit is configured to group data to be transmitted so that each group includes at least one data sample;

A compressing unit is configured to determine for each group a shift factor according to a most significant bit of a data sample, excluding a sign bit, with the largest value in the group; to left-shift data bits of respective data samples in the group respectively by the shift factor; and to quantize the respective left-shifted data samples respectively so that the number of bits of each quantized data sample is equal to a target number of compressed bits; and A transmitting unit is configured to transmit the shift factor and the respective quantized data samples.

Based upon the same inventive idea as the method, an embodiment of the invention further provides an RRU which is a receiving terminal including:

A receiving unit is configured to receive a shift factor and respective quantized data samples;

A de-quantifying unit is configured to de-quantize the respective data samples respectively so that the number of bits of each de-quantized data sample is equal to the original number of bits before quantization; and A shifting unit is configured to right-shift data bits in the respective de-quantized data samples respectively by the shift factor to obtain the decompressed data samples.

Based upon the same inventive idea as the method, an embodiment of the invention further provides a BBU which is a receiving terminal including:

A receiving unit is configured to receive a shift factor and respective quantized data samples;

A de-quantifying unit is configured to de-quantize the respective data samples respectively so that the number of bits of each de-quantized data sample is equal to the original number of bits before quantization; and A shifting unit is configured to right-shift data bits in the respective de-quantized data samples respectively by the shift factor top obtain the decompressed samples.

Based upon the same inventive idea as the method, an embodiment of the invention further provides an RRU including a processor, where:

When the RRU is a transmitting terminal, the processor is configured to group data to be transmitted so that each group includes at least one data sample; to determine for each group a shift factor according to a most significant bit of a data sample, with the largest value excluding a sign bit in the group; to left-shift data bits of respective data samples in the group respectively by the shift factor; to quantize the respective left-shifted data samples respectively so that the number of bits of each quantized data sample is equal to a target number of compressed bits; and to transmit the shift factor and the respective quantized data samples to a receiving terminal; and When the RRU is a receiving terminal, the processor is configured to receive a shift factor, and respective quantized data samples, transmitted by a transmitting terminal; to de-quantize the respective data samples respectively so that the number of bits of each de-quantized data sample is equal to the original number of bits before quantization; and to right-shift data bits in the respective de-quantized data samples respectively by the shift factor to obtain the decompressed samples.

Based upon the same inventive idea as the method, an embodiment of the invention further provides a BBU including a processor, where:

When the BBU is a transmitting terminal, the processor is configured to group data to be transmitted so that each group includes at least one data sample; to determine for each group a shift factor according to the most significant bit of a data sample, with the largest value excluding a sign bit in the group; to left-shift data bits of respective data samples in the group respectively by the shift factor; to quantize the respective left-shifted data samples respectively so that the number of bits of each quantized sample is equal to a target number of compressed bits; and to transmit the shift factor and the respective quantized data samples to a receiving terminal; and When the BBU is a receiving terminal, the processor is configured to receive a shift factor, and respective quantized data samples, transmitted by a transmitting terminal; to de-quantize the respective data samples respectively so that the number of bits of each de-quantized sample is equal to the original number of bits before quantization; and to right-shift data bits in the respective de-quantized data samples respectively by the shift factor to obtain the decompressed samples.

The invention has been described in a flow chart and/or a block diagram of the method, the device (system) and the computer program product according to the embodiments of the invention. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method for compressing and transmitting data, the method comprising:
   grouping, by a transmitting terminal, the data to be transmitted into a plurality of groups so that each of the groups comprises at least one data sample, each of the at least one data sample comprises a sign bit, a plurality of data bits representing plural real data components, and a plurality of data bits representing plural imaginary data components; and
   for each of the groups, determining, by the transmitting terminal, a shift factor according to a most significant bit of one of the at least one data sample, which has a largest value excluding a sign bit; left-shifting the data bits of the at least one data sample by the shift factor to produce at least one left-shifted data sample; quantizing the at least one left-shifted data sample to produce at least one quantized data sample including a plural number of bits so that the number of the bits of each of the at least one quantized data sample is equal to a predefined bit number; and transmitting the shift factor and the at least one quantized data sample to a receiving terminal.

2. The method according to claim 1, wherein when the data to be transmitted consists of a real component (I data) and an imaginary component (Q data) of data (IQ data) to be transmitted on a plurality of antennas, the grouping the data to be transmitted comprises:
   grouping the IQ data to be transmitted on each of the plurality of antennas separately, and grouping the I data and the Q data separately so that at least one consecutive I data to be transmitted on one of the antennas are grouped together or at least one consecutive Q data to be transmitted on one of the antennas are grouped together; or
   grouping the IQ data to be transmitted on each of the plurality of antennas separately; and grouping the l data and the Q data jointly so that at least one consecutive I data and at least one consecutive Q data to be transmitted on one of the antennas are grouped together; or
   grouping the IQ data to be transmitted on the plurality of antennas jointly, and grouping the I data and the Q data separately so that the I data to be transmitted on the antennas at same time locations are grouped together or the Q data to be transmitted on the antennas at the same time locations are grouped together; or
   grouping the IQ data to be transmitted on the plurality of antennas jointly, and grouping the I data and the Q data jointly so that the I data and the Q data to be transmitted on the antennas at the same time locations are grouped together; or
   grouping the IQ data to be transmitted on the plurality of antennas jointly, and grouping the I data and the Q data separately so that at least one consecutive I data to be transmitted on the antennas at the same time locations are grouped together or at least one consecutive Q data to be transmitted on the antennas at the same time locations are grouped together; or
   grouping the IQ data to be transmitted on the plurality of antennas jointly, and grouping the I data and the Q data jointly so that at least one consecutive I data and Q data to be transmitted on the antennas at the same time locations are grouped together.

3. The method according to claim 1, wherein the determining the shift factor according to the most significant bit of one of the at least one data sample which has the largest value excluding the sign bit comprises:
   determining a largest number of shift bits which can be represented by the shift factor;
   determining the one of the at least one data sample, which has the largest value excluding the sign bit, and a bit index of the most significant bit of the one of the at least one data sample excluding the sign bit; and
   if A is no larger than the largest number of shift bits, then determining the shift factor to be equal to A; otherwise, determining the shift factor to be equal to the largest number of shift bits, wherein A=W−1−H, W represents the number of bits of the one of the at least one data sample excluding the sign bit, and H represents the bit index of the most significant bit.

4. The method according to claim 3, wherein the largest number C of shift bits which can be represented by the shift factor is determined in the equation of:

$$C=2^{(n*k/2)}-1,$$

wherein ^ represents the power, n represents the number of the at least one data sample, and k represents the number of control bits in which the shift factor is transmitted.

5. The method according to claim 3, wherein after the step of determining the largest number of shift bits which can be represented by the shift factor, and before the step of determining the one of the at least one data sample, which has the largest value excluding the sign bit and the bit index of the most significant bit of the one of the at least one data sample excluding the sign bit, the method further comprises:
   if the bit index of the most significant bit of the one of the at least one data sample, which has the largest value excluding the sign bit, is E, or there are more than a preset proportion of the data sample among the at least one data samples, of which the bit index of the most significant bit with the sign bit being excluded is smaller than or equal to E, then limiting each of the at least one data samples into E bits, wherein E represents an integer larger than 0.

6. The method according to claim 1, wherein the quantizing the at least one left-shifted data samples to produce at least one quantized data sample comprises:
   for each of the at least one left-shifted data sample, maintaining the sign bit, capturing (V−1) hits of data starting from the most significant bit to least significant hit among the data bits, and forming the quantized data sample from the sign bit and the captured bits of data, wherein V represents the redefined bit number.

7. The method according to claim 1, wherein the transmitting terminal is a Radio Remote Unit (RRU), and the receiving terminal is a Base Band Unit (BBU); or
   the transmitting terminal is a BBU, and the receiving terminal is an RRU.

8. A method for decompressing data, the method comprising:
   receiving, by a receiving terminal, a shift factor, and at least one data sample quantized by a transmitting terminal, each of the at least one data sample comprising a sign bit, a plurality of data bits representing plural real data components, and a plurality of data bits representing plural imaginary data components;

de-quantizing, by the receiving terminal, the at least one data sample to produce at least one de-quantized data sample, so that a number of bits of each of the at least one de-quantized data sample is equal to a number of the bits of the at least one data sample without being quantized by the transmitting terminal, wherein each of the at least one data sample without being quantized by the transmitting terminal comprises a sign bit and a plurality of data bits; and right-shifting, by the receiving terminal, data bits of the at least one de-quantized data sample by the shift factor to obtain at least one decompressed data sample.

9. The method according to claim 8, wherein the de-quantizing, by the receiving terminal, the at least one data sample comprises:

padding B zeros to a right side of each of the at least one data sample to obtain the at least one de-quantized data sample, wherein B=W−V, W represents a number of the bits of each of the at least one data sample without being quantized excluding the sign bit, and V represents a number of the bits of each of the at least one data sample quantized.

10. The method according to claim 9, wherein after the step of de-quantizing, and before the step of right-shifting, the method further comprises:

adding a preset offset to each of the at least one de-quantized data samples, wherein the preset offset ranging (0, 2^(B−1)], and ^ represents the power; and the right-shifting the data bits of the at least one de-quantized data samples by the shift factor comprises:

right-shifting the data bits of the at least one de-quantized data sample, with the added preset offset, by the shift factor.

11. The method according to claim 8, wherein the transmitting terminal is an RRU, and the receiving terminal is a BBU; or the transmitting terminal is a BBU, and the receiving terminal is an RRU.

12. A device for compressing and transmitting data, the device comprising:

a processor configured to group data to be transmitted into a plurality of groups so that each of the groups comprises at least one data sample, each of the data sample comprises a sign bit, a plurality of data bits representing plural real data components, and a plurality of data bits representing plural imaginary data components; and for each of the groups, to determine a shift factor according to a most significant bit of one of the at least one data sample, which has a largest value excluding a sign bit; to left-shift data bits of the at least one data sample by the shift factor to produce at least one left-shifted data sample; and to quantize the at least one left-shifted data sample to produce at least one quantized data sample including a plural number of bits so that the number of the bits of each of the at least one quantized data sample is equal to a predefined bit number; and a transmitter configured to transmit the shift factor and the at least one quantized data sample.

13. The device according to claim 12, wherein the processor is configured:

when the data to be transmitted consists of a real component (I data) and an imaginary component (Q data) of data (IQ data) to be transmitted on a plurality of antennas, to group the data to be transmitted as follows:

to group the IQ data to be transmitted on each of the plurality of antennas separately, and to group the I data and the Q data separately so that at least one consecutive I data to be transmitted on one of the antennas are grouped together or at least one consecutive Q data to be transmitted on one of the antennas are grouped together; or to group the IQ data to be transmitted on each of the plurality of antennas separately, and to group the I data and the Q data jointly so that at least one consecutive I data and at least one consecutive Q data to be transmitted on one of the antennas are grouped together; or to group the IQ data of to be transmitted on the plurality of antennas jointly, and to group the I data and the Q data separately so that the I data to be transmitted on the antennas at same time locations are grouped together or the Q data to be transmitted on the antennas at the same time locations are grouped together; or to group the IQ data to be transmitted on the plurality of antennas jointly, and to group the I data and the Q data jointly so that the I data and the Q data to be transmitted on the antennas at the same time locations are grouped together; or to group the IQ data to be transmitted on the plurality of antennas jointly, and to group the I data and the Q data separately so that at least one consecutive I data to be transmitted on the antennas at the same time locations are grouped together or at least one consecutive Q data to be transmitted on the antennas at the same time locations are grouped together; or to group the IQ data to be transmitted on the plurality of antennas jointly, and to group the I data and the Q data jointly so that at least one consecutive I data and Q data to be transmitted on the antennas at the same time locations are grouped together.

14. The device according to claim 12, wherein the processor configured to determine the shift factor according to the most significant bit of the one of the at least one data sample, which has the largest value excluding the sign bit, is configured:

to determine a largest number of shift bits which can be represented by the shift factor;

to determine the one of the at least one data sample, which has the largest value excluding the sign bit, and a bit index of the most significant bit of the one of the at least one data sample excluding the sign bit; and if A is no larger than the largest number of shift bits, to determine the shift factor to be equal to A; otherwise, to determine the shift factor to be equal to the largest number of shift bits, wherein A=W−1−H, W represents the number of bits of the one of the at least one data sample excluding the sign bit, and H represents the bit index of the most significant bit.

15. The device according to claim 14, wherein the processor is configured to determine the largest number C of shift bits which can be represented by the shift factor in the equation of:

$$C=2^{(n*k/2)}-1,$$

wherein ^ represents the power, n represents the number of the at least one data sample, and k represents the number of control bits in which the shift factor is transmitted.

16. The device according to claim 14, wherein the processor is further configured:

if the bit index of the most significant bit of the one of the at least one data sample, which has the largest value excluding the sign bit, is E, or there are more than a preset proportion of the data sample among the at least one data sample, of which the bit indexes of the most significant bit with the sign bit being excluded is smaller than or equal to E, to limit each of the at least one data sample into E bits, wherein E represents an integer larger than 0.

17. The device according to claim 12, wherein the processor is configured to:
for each of the at least one left-shifted data sample, to maintain the sign bit, to capture (V−1) bits of data starting from the most significant bit to least significant bit among the data bits, and to form the quantized data sample from the sign bit and the captured bits of data, wherein V represents the predefined bit number.

18. A device for decompressing data, the device comprising:
a receiver configured to receive a shift factor and at least one data sample quantized by a transmitting terminal, each of the at least one data sample comprising a sign bit, a plurality of data bits representing plural real data components, and a plurality of data bits representing plural imaginary data components;
a processor configured to de-quantize the at least one data sample quantized to produce at least one de-quantized data sample, so that a number of bits of each of the at least one de-quantized data sample is equal to a number of the bits of the at least one data sample without being quantized by the transmitting terminal, wherein each of the at least one data sample without being quantized by the transmitting terminal comprises a sign bit and a plurality of data bits; and
to right-shift data bits of the at least one de-quantized data sample by the shift factor to obtain at least one decompressed data sample.

19. The device according to claim 18, wherein the processor is configured:
to pad B zeros to a right side of each of the at least one data sample resulting in the at least one de-quantized data sample, wherein B=W−V, W represents a number of the bits of each of the at least one data sample without being quantized, excluding the sign bit, and V represents a number of the bits of each of the at least one data sample quantized.

20. The device according to claim 18, wherein the processor is further configured:
to add a preset offset to each of the at least one de-quantized data samples wherein the preset offset has a range of (0, $2^{(B-1)}$], and ^ represents the power; and
the processor is configured:
to right-shift the data bits of the at least one de-quantized data sample, with the added preset offset, by the shift factor.

* * * * *